United States Patent
Interrante et al.

(12) 
(10) Patent No.: US 6,892,925 B2
(45) Date of Patent: *May 17, 2005

(54) SOLDER HIERARCHY FOR LEAD FREE SOLDER JOINT

(75) Inventors: Mario Interrante, New Paltz, NY (US); Mukta G. Farooq, Hopewell Junction, NY (US); William Sablinski, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

This patent is subject to a terminal disclaimer.

(21) Appl. No.: 10/246,282

(22) Filed: Sep. 18, 2002

(65) Prior Publication Data

US 2004/0050904 A1 Mar. 18, 2004

(51) Int. Cl.$^7$ .......................... B23K 35/14; H01L 21/44
(52) U.S. Cl. .................. 228/56.3; 228/245; 228/246; 438/612
(58) Field of Search .................. 228/56.3, 245, 228/246; 420/557, 560; 438/612

(56) References Cited

U.S. PATENT DOCUMENTS

| | | | |
|---|---|---|---|
| 4,778,733 A | 10/1988 | Lubrano et al. | |
| 5,011,658 A | 4/1991 | Niedrich | |
| 5,147,084 A | 9/1992 | Behun et al. | |
| 5,672,542 A | 9/1997 | Schwiebert et al. | |
| 5,729,440 A | 3/1998 | Jimarez et al. | |
| 5,863,493 A | 1/1999 | Achari et al. | |
| 6,158,644 A | 12/2000 | Brofman et al. | |
| 6,333,563 B1 | 12/2001 | Jackson et al. | |
| 6,429,388 B1 | 8/2002 | Interrante et al. | |
| 6,436,703 B1 | 8/2002 | Tang et al. | |
| 6,436,730 B1 | 8/2002 | Melton et al. | |
| 6,464,122 B1 * | 10/2002 | Tadauchi et al. ............. 228/1.1 |
| 6,518,089 B2 | 2/2003 | Coyle | |
| 6,541,305 B2 | 4/2003 | Farooq et al. | |
| 6,574,859 B2 | 6/2003 | Farooq et al. | |
| 6,581,821 B2 | 6/2003 | Sarkhel | |
| 6,638,847 B1 * | 10/2003 | Cheung et al. ............. 438/612 |
| 2001/0018230 A1 | 8/2001 | Jimarez et al. | |
| 2001/0026957 A1 | 10/2001 | Atwood et al. | |
| 2002/0064678 A1 * | 5/2002 | Kiyotoki et al. ............ 428/678 |
| 2002/0192443 A1 | 12/2002 | Sarkhel | |
| 2002/0192935 A1 * | 12/2002 | Joshi et al. ................. 438/612 |
| 2003/0230806 A1 | 12/2003 | Yamashita et al. | |

FOREIGN PATENT DOCUMENTS

| | | |
|---|---|---|
| JP | 5136216 A | 1/1993 |
| JP | 2000-301376 A * | 10/2000 |
| JP | 2001-035978 | 2/2001 |
| JP | 2002-124533 A * | 4/2002 |
| WO | WO 02/063674 | 8/2002 |

* cited by examiner

*Primary Examiner*—Lynne R. Edmondson
(74) *Attorney, Agent, or Firm*—James J. Cioffi

(57) ABSTRACT

A lead free solder hierarchy for use in the second level solder connection of electronic components such as joining an electronic module to a circuit board. An off-eutectic solder concentration of SnCu or SnAg is used for the module side connection. This off-eutectic solder contains sufficient intermetallics to provide the module side connection with a robust second level assembly and rework process. The off-eutectic composition provides an inter-metallic phase structure in the module side fillet during assembly. The inter-metallic phase structure eliminates problems of tilt and collapse during second level assembly and aids in rework by providing a more cohesive joint allowing removal of the columns from the board without simultaneous removal from the module.

16 Claims, 5 Drawing Sheets

SOLDER HIERARCHY FOR LEAD FREE SOLDER JOINT

BACKGROUND OF THE INVENTION

This invention relates to a lead free solder structure for the assembly of electronic components, and more particularly, to a lead free solder hierarchy for use in a second level solder connection in electronic components such as joining an electronic module to a circuit card or board.

The use of solder to join components in an electronic assembly is well known in the art. There are a variety of electronic components which require connection to other electronic components or to other levels of packaging. Typical examples are second level surface mount technology where column grid arrays (CGA) or ball grid arrays (BGA) are used to form an interconnection between a circuit board and an electronic module assembly such as a semiconductor chip attached to a multilayer ceramic (MLC) substrate.

The module assemblies are connected to the board or card by joining solder balls or columns to the substrate bottom surface metallurgy (BSM). The module is subsequently joined to the board or card in what is referred to as a second level assembly.

For various environmental reasons the industry is moving to a lead free solder strategy for component assembly. The current lead free interconnect solution is to use Tin/Silver/Copper eutectic as the joining alloy for both the module and card side joints. This alloy is used because most of the higher melting alloys have other problems associated with them. For example, Tin Antimony (235–240° C.) has environmental issues regarding oxides of antimony.

The current solution to a lead free system is to use the same solder alloy (Sn/Ag/Cu of a specific composition, such as 3.8Ag, 0.7Cu, balance Sn) on both the module and card or board side column joints. This has two significant problems associated with it. First is that the column may tilt or collapse during second level assembly because the fillet on the module side will undergo melting. Joining of Cu columns with Sn, Ag and Cu (SAC) on the module bottom surface metallurgy BSM pad and SAC paste on the card side causes modules to fall over during joining at 235° C. SAC eutectic melts at 217° C. Second, the card rework process becomes much more involved because during module removal from the card almost all of the columns will remain on the card and then have to be painstakingly removed prior to rejoin. Rework of modules from the card would leave many columns behind on the card. This is extremely messy and time consuming in manufacturing production. Another problem is that no readily available alloy exists with a melting temperature between 220° C. and 260° C. that does not have associated environmental, process or reliability issues.

The present invention solves these problems by creating a solder melting hierarchy for second level assembly. The present invention provides an off-eutectic concentration of SnCu or SnAg that adds sufficient intermetallics to the module BSM fillet to satisfy the following requirements: The material must reflow and wet at the standard joining temperatures from 235° C. to 260° C. to satisfy all lead free solder applications. The material must stabilize the module BSM joint to prevent modules from falling over during joining to the card or circuit board. The material must remain cohesive during card or board rework to insure as many columns as possible stay attached to the module and are not left behind on the card or board.

The present invention discloses the use of off-eutectic lead free solder alloys containing two or more of the following: tin, silver, copper. These off-eutectic compositions contain secondary intermetallic phases which melt at a temperature above 280° C. and add substantial structural support to the module BSM joint. The present invention achieves the desired temperature hierarchy in the module/Column BSM joint which allows for card or board attach without the assistance of a mechanical standoff and module removal/rework from the card or board whereby the majority of columns remain attached to the module BSM. This eliminates the problems involved when the same solder is used on both the module side and card side pads. Without a solder temperature hierarchy, all or most of the columns remain on the card or board through rework creating a very labor intensive exercise in preparing the site for the rejoin of a new module. The invention is the use of different alloys to create a stable structure during initial card join and subsequent module/card rework to prevent column collapse.

This material solution can also replace the single melt Sn, Ag and Cu (SAC) solder ball planned for lead free BGA. These and other purposes of the present invention will become more apparent after referring to the following description considered in conjunction with the accompanying drawings.

BRIEF SUMMARY OF THE INVENTION

The purposes and advantages of the present invention have been achieved by providing a lead free solder hierarchy structure for use in second level packaging assembly. In one embodiment an off-eutectic solder composition of between 90.0–99.0% Sn, between 10.0–1.0% Cu, and having intermetallics with a melting temperature above 280° C., is used for the module side connection. In a preferred embodiment the off-eutectic solder composition is about 93.0% Sn, 7.0% Cu and has dispersed grains of SnCu inter-metallic phase structure.

In another embodiment an off-eutectic solder composition of between 80.0–96.0% Sn, between 20.0–4.0% Ag; and having inter-metallics with a melting temperature above 280° C. is used for the module side connection. In a preferred embodiment the off-eutectic solder composition is about 82.0% Sn, 18.0% Ag and has dispersed grains of SnAg inter-metallic phase structure. In another preferred embodiment the off-eutectic solder composition is about 88.0% Sn, 12.0% Ag and has dispersed grains of SnAg inter-metallic phase structure.

In another aspect of the present invention the off-eutectic solder composition is used to provide a method for creating a solder melting hierarchy for second level lead free solder assembly.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
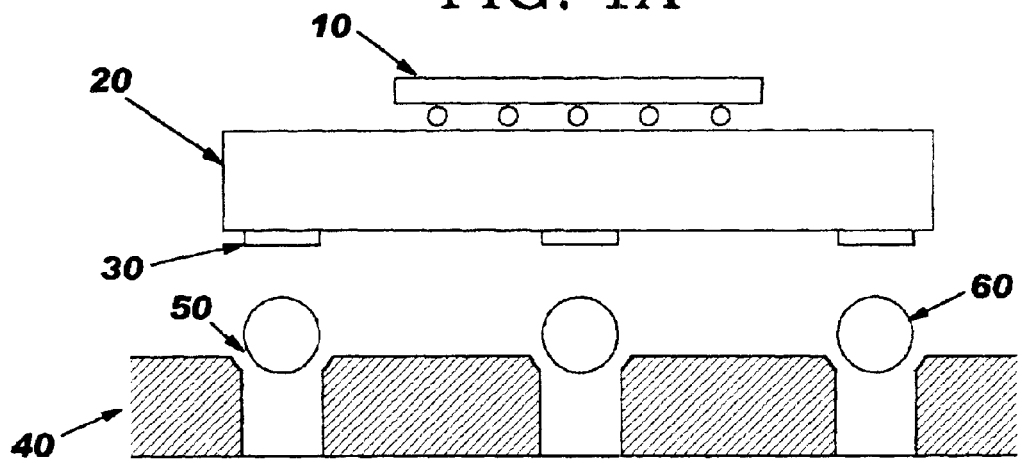
FIGS. 1a–1f represent a first method to provide a lead free solder hierarchy for use in second level assembly.

The purposes of the present invention have been achieved by providing a solder melting hierarchy for second level assembly.

The need for a solder melting hierarchy is driven by the fact that card assembly houses are moving towards a common solution for lead free solders for attachment of modules to cards or circuit boards. However, the joining temperature cannot be higher than is allowed by the top surface metallurgy (TSM) structure. The industry trend toward a card side solder of eutectic 95.5Sn/3.8Ag/0.7Cu (or close to that composition) means that an off-eutectic composition with an inter-metallic phase structure with a liquidus temperature higher than the ternary eutectic temperature of 95.5Sn/3.8Ag/0.7Cu solder (hereafter referred to as "SAC") in the card solder paste is desirable. The SAC eutectic temperature is 217° C. An off eutectic composition will allow an inter-metallic phase structure to exist in the module side fillet during card join. Such an inter-metallic phase structure, which is evidence of incomplete liquification, is critical in eliminating the issues of tilt and collapse during assembly.

Similarly, the inter-metallic phase structure will aid in card rework by providing a more cohesive BSM joint thereby allowing removal of the columns from the cards, without simultaneous removal from the module. Examples of such off-eutectic solder alloys which have shown outstanding results are 82Sn/18Ag and 93Sn/7Cu.

The present invention is directed to alloys of SnCu (Tin/Copper) and SnAg (Tin/Silver). In the case of Tin/Copper, where the eutectic alloy composition is 99.3% Sn and 0.7% Cu (227° C.), the alloys evaluated were 97Sn/3Cu and 93Sn/7Cu. In card joining at 235° C. with a 97Sn/3Cu alloy encouraging results were obtained but improvements were necessary to achieve a more robust card join and rework process. In card joining at 235° C. with a 93Sn/7Cu alloy, all modules remained upright without the need for any rework In contrast, previous card joining attempts at 235° C., using SAC as both the module and card side solder paste, resulted in all modules falling over. The only alternative was to use standoffs attached to the corner of the module for physical support of the modules.

The eutectic composition for Tin/Silver was 96.5% Sn/3.5% Ag at 221° C. The off-eutectic alloy compositions evaluated were 90Sn/10Ag, 88Sn/12Ag and 82Sn/18Ag. In card joining at 235° C. with a 90Sn/10Ag alloy encouraging results were obtained, but again improvements were necessary to achieve a more robust card join and rework process. In card joining with the 88Sn/12Ag alloy, all modules survived a 235° C. card join reflow. In card joining with the 82Sn/18Ag alloy, all modules remained upright during a 245° C. reflow.

Therefore, for second level solder assembly with a reflow of 235° C. the preferred off-eutectic solder alloy is either 93Sn/7Cu, 88Sn/12Ag or 82Sn/18Ag. For second level assembly with reflow requirements of 245° C. or higher the preferred off-eutectic solder alloy is 82Sn/18Ag. These off-eutectic solder alloys form the inter-metallic phase structure during attachment to the module BSM. In the case where the off-eutectic solder alloy is 93Sn/7Cu, the inter-metallics are $Cu_6Sn_5$ and $Cu_3Sn$. In the case where the off-eutectic solder alloy is 88Sn/12Ag or 82Sn/18Ag the inter-metallics are $Ag_3Sn$. It will be apparent to those skilled in the art that higher card join reflow temperatures may require the use of off-eutectic solder alloys, with higher concentrations of intermetallic phase structure.

The preferred volume of off-eutectic solder alloy will depend on the size of the contact pad and the size of the interconnect feature, i.e., ball, column, etc. The volume preferred for each off-eutectic solder composition described above is in the range of between about 2,000 to 7,000 cubic mils. The BSM contact pads were 32 mils in diameter and the column diameter was 10 mils. In the evaluations discussed above the lead free columns used were copper columns. However, the present invention is not limited to use with copper columns. The present solder hierarchy is also applicable to standard kovar (NiFe) alloys with a readily solderable plated coating, and alloys of Ni, Co, Cu, and Pt. Similarly, the present invention is also compatible with lead free solder balls or lead free solder connections in general.

It will be apparent to those skilled in the art that the additions of small amounts of a third, or even a fourth element, to the disclosed Tin/Copper and Tin/Silver off-eutectic alloys would not effect the hierarchy structure and such additions are therefore within the scope of the disclosed invention. The elements added would have to readily form an intermetallic compound with Tin as does the Copper and Silver. Examples of possible additional elements include Nickel, Cobalt and Gold as Nickel/Tin, Cobalt/Tin and Gold/Tin are well known Tin intermetallics.

The present invention is also not limited to a column interconnect. It is also applicable to "springs", "connectors", "s-connectors", "c-connectors", "cantilever beams", and just about any assembly where a member is hard joined on both sides, ie, ceramic and card sides. The present invention allows the use of acceptable lead-free alloy systems, with the additional advantage of a temperature hierarchy, without the need for mechanical standoffs to aid in the joining/rework processes.

A preferred method is illustrated with reference to FIG. 1a which shows a circuit chip 10 attached to a top side of an electronic module 20. Bottom surface metallurgy (BSM) pads 30 are provided on the bottom surface of the module 20. A preform boat 40, typically made of graphite, contains openings 50 which are arrayed to coincide with the position of the BSM pads 30 on the module 20. The off-eutectic solder preforms 60 of the present invention are then placed in the boat openings 50. The module 20 is then positioned on the boat 40 such that the BSM pads 30 are in contact with the off-eutectic solder preforms 60. The resulting module/boat assembly is then heated to the required reflow temperature, typically between 235° C. and 245° C., whereby the solder preforms 60 are reflowed onto the BSM pads 30. The module/boat assembly is then cooled resulting in the BSM pads 30 being coated with the off-eutectic solder alloy.

Figure 1B:
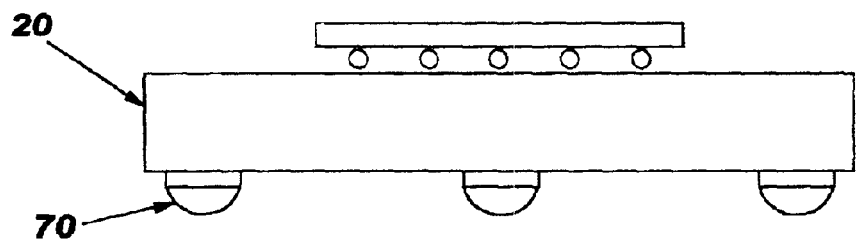
Figure 1C:
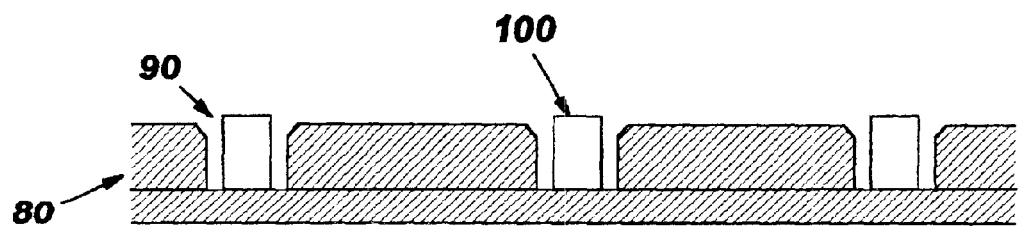

Referring now to FIG. 1b the module 20 after reflow is shown. The resulting off-eutectic coated BSM pads are commonly referred to as solder bumps 70. Referring to FIG. 1c a second boat 80, typically made of graphite, contains openings 90 which are arrayed to coincide with the position of the solder bumps 70. Lead free solder columns, in this example copper columns 100, are placed in the boat openings 90.

Figure 1D:
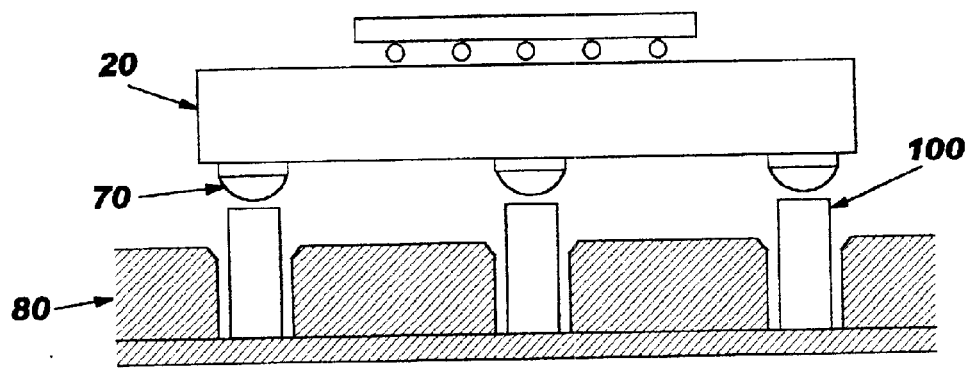

Referring to FIG. 1d the module 20 is positioned on the boat 80 such that the solder bumps 70 are in contact with the ends of the columns 100. The resulting module/boat assembly is then heated to the required reflow temperature. For copper columns up to 260° C., and preferably 250° C. Depending on the particular solder hierarchy used this refow temperature could be over 350° C. The solder bumps 70 reflow on the ends of the columns 100 and after cooling form the module side solder fillets which adhere the columns 100 to the module 20.

Figure 1E:
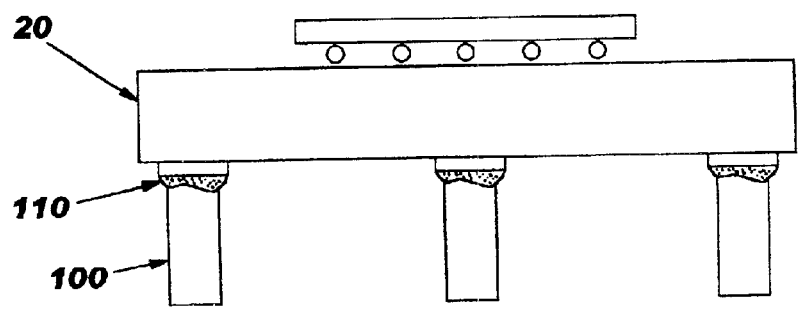
Figure 1F:
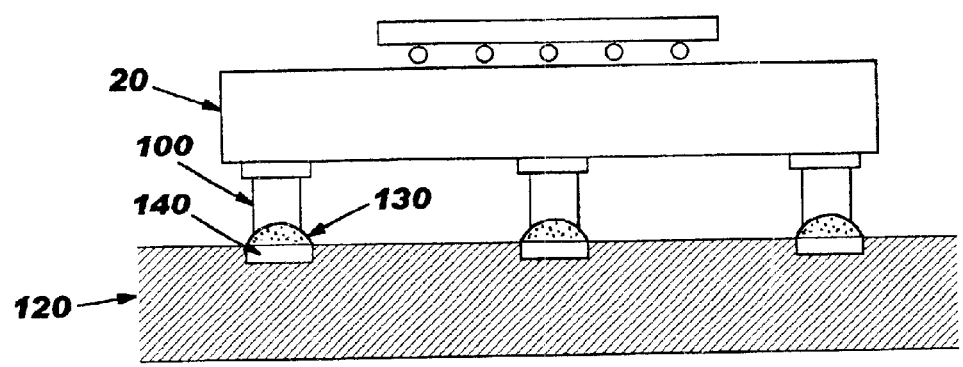

Referring now to FIG. 1e the module 20 is shown with columns 100 attached by the resulting inter-metallic phase structure 110 of the present invention. Referring now to FIG. 1f the resulting module 20 with columns 100 attached in now assembled to a circuit board or card 120. The circuit board 120 has electrical contact pads 140. SAC solder paste 130 is applied to the contact pads 140. The columns 100 are placed on the board 120 so that the free ends of the columns 100 are in contact with the SAC solder paste 130. The module/board assembly is then heated to reflow the SAC solder paste on the column ends. Upon cooling the reflowed SAC solder paste forms the solder joint which adheres the columns to the board 120. This resulting module/board assembly comprises the solder hierarchy between the module and board side joints of the present invention.

Figure 2A:
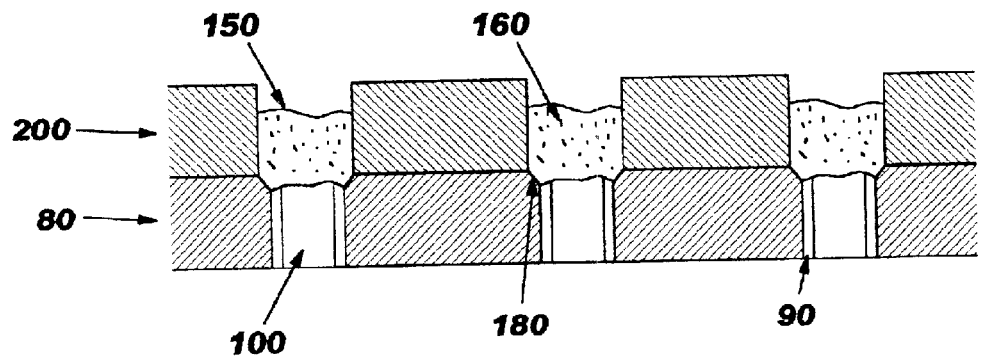
FIGS. 2a–2e represent a second method to provide a lead free solder hierarchy for use in second level assembly.

Referring now to FIG. 2a there is illustrated a second method using a screen-on column process, whereby the off-eutectic solder alloy of the present invention, in paste form, is screened onto the column array and then reflowed. This method saves one reflow step. A screening mask 200, typically made from Mo or stainless steel, is placed on a column boat 80 containing lead free solder columns 100. In this embodiment the column boat 80 contains fillet openings 180 or enlarged upper portions of the column openings 90. The screening mask 200 has mask openings 150 which are arrayed to coincide with the positions of the solder columns 100. The off-eutectic solder paste 160, which is made of the same composition as the off-eutectic solder preforms 60, is screened into the mask openings 150 and fillet openings 180.

Figure 2B:
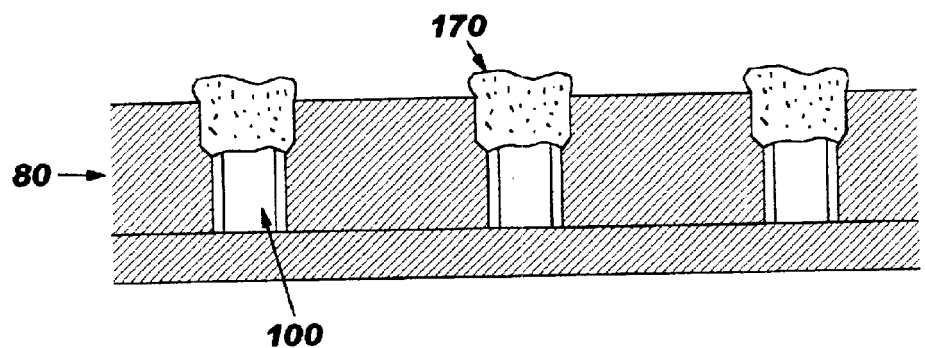

Referring now to FIG. 2b, the screening mask 200 is removed and the columns 100 in the column boat 80 are left with an off-eutectic "solder paste bump" 170 on one end of the columns 100. The geometry of this solder paste bump 170 is determined by the combination of the thickness of the screening mask 200 and by the geometry of the fillet openings 180 in the column boat 80.

Figure 2C:
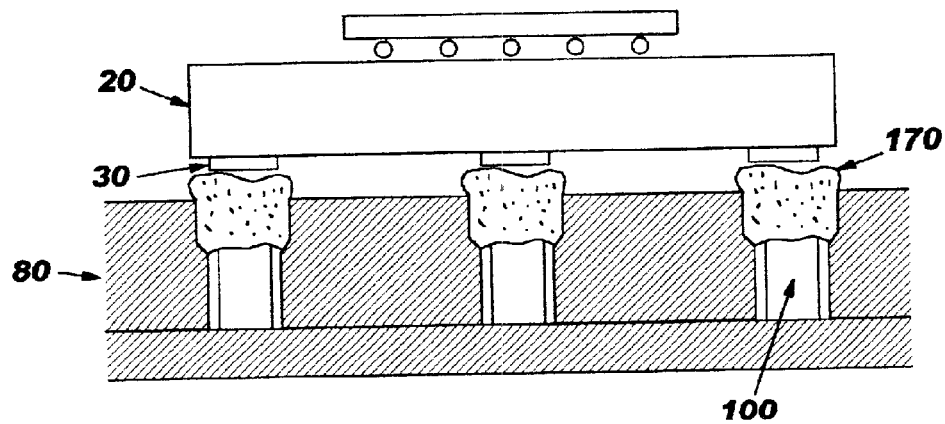

Referring now to FIG. 2c, the module 20 with BSM pads 30 is placed on the column boat 80 such that the BSM pads 30 are in contact with the off-eutectic solder paste bumps 170. The resulting module/boat assembly is then heated to the required reflow temperature. For lead free copper columns up to 245° C., and preferably 250° C. Depending on the particular solder hierarchy used this refow temperature could be over 350° C. The off-eutectic solder paste bumps 170 reflow on the ends of the columns 100 and after cooling form the module side solder fillets which adhere the columns 100 to the module 20.

Figure 2D:
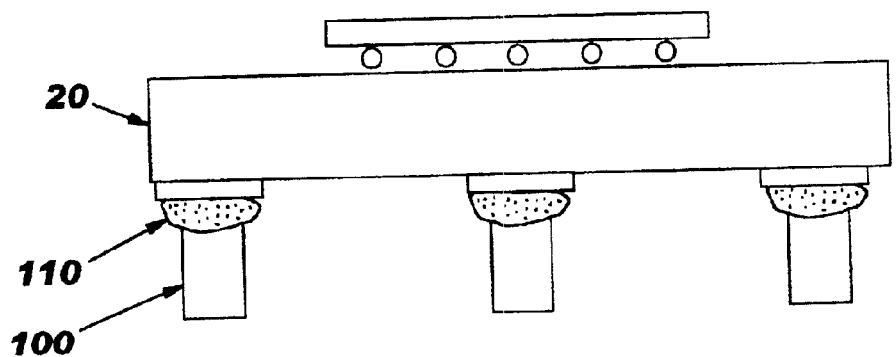
Figure 2E:
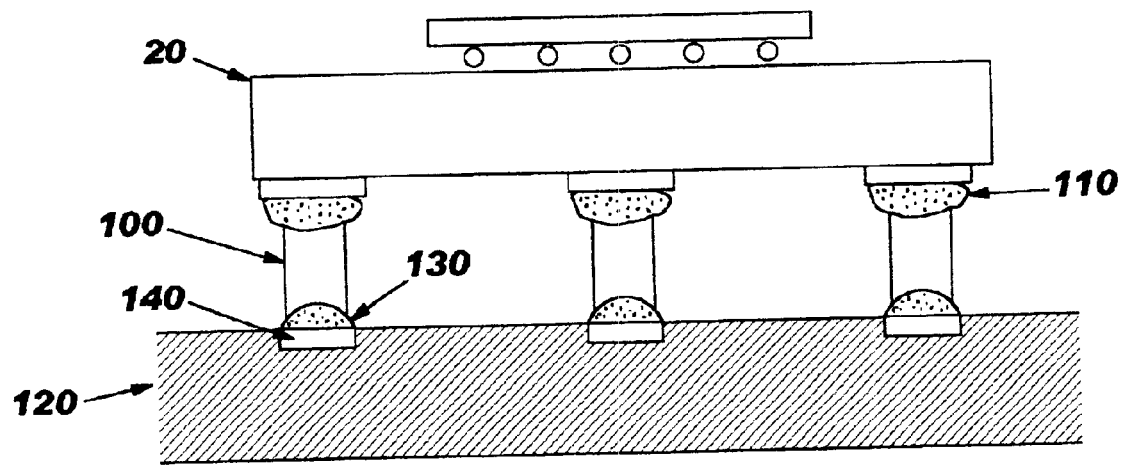

Referring now to FIG. 2d, the module 20 is shown with columns 100 attached with the resulting inter-metallic phase structure 110 of the present invention. Referring now to FIG. 2e the resulting module 20 with columns 100 attached in now assembled to a circuit board or card 120. The circuit board 120 has electrical contact pads 140. SAC solder paste 130 is applied to the contact pads 140. The columns 100 are placed on the board 120 so that the free ends of the columns 100 are in contact with the SAC solder paste 130. The module/board assembly is then heated to reflow the SAC solder paste on the column ends. Upon cooling the reflowed SAC solder paste forms the solder joint which adheres the columns to the board 120. This resulting module/board assembly comprises the solder hierarchy between the module and board side joints of the present invention.

In surviving the card attach reflow without requiring the use of standoff supports the present invention has achieved a solder hierarchy which does not exist presently. Not only is this critical to the initial card joining, but it is also very critical to card rework. With the present invention the majority (95% or more) of the columns remain attached to the module during reflow/removal from the card.

While the preferred embodiments are described above, it will be appreciated by one skilled in the art that a range of off-eutectic solder compositions for the Sn/Ag and Sn/Cu and Sn/Ag/Cu systems are also within the scope of the present invention. When these off-eutectic solder solutions are used on the module side, in conjunction with the "standard" National Electronics Manufacturing Initiative (NEMI) alloy in the range of 3.8 to 4.0 weight % Ag, 0.5–0.9 weight % Cu, balance Sn, used on the card side, a natural temperature hierarchy is achieved, greatly facilitating the process of joining and also of reworking. This occurs because the off-eutectic solder alloy contains inter-metallic compounds whose liquidus temperature are higher then that of the card side solder alloy. Therefore, although there may be onset of melting, there is incomplete liquification, leading to an inter-metallic phase structure. This inter-metallic phase structure, which has higher resultant viscosity, is the key enabler for this solution. It prevents the columns, or other members, from collapsing during joining/rework processes.

The present invention is not limited to these compositions alone. The disclosure is to use one of these alloys, or similar compositions of the same components, to resolve the above mentioned problems of column tilt and rework. Increasingly, card assembly houses are moving towards a common lead free solder for card side attach, and the chosen composition seems to be close to 95.5Sn/3.8Ag/0.7Cu.

Figure 3:
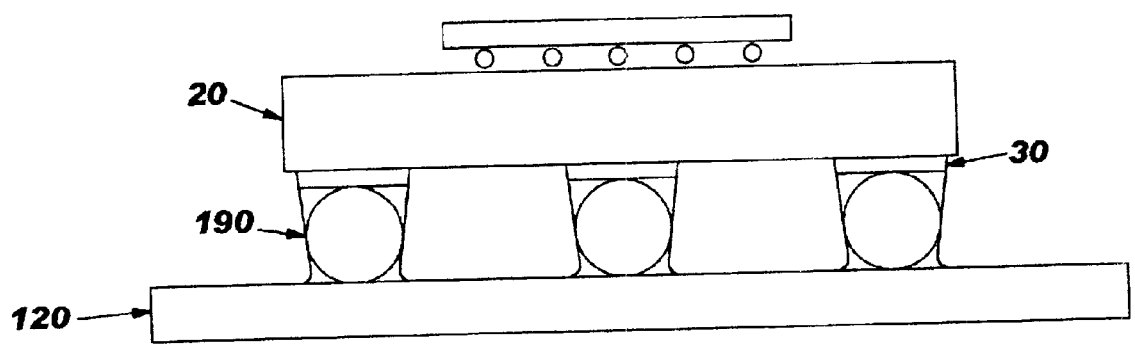
FIG. 3 is a schematic cross section of a lead free BGA structure according to the present invention.

The present invention is also not limited to the second level assembly methods described above. It will be apparent to those skilled in the art that other lead free second level assembly methods may be easily adapted to benefit from the use of the off-eutectic solder composition of the present invention. An example is illustrated in FIG. 3 where the off-eutectic solder composition is used as the solder ball 190 for second level BGA assembly of the module 20, having BSM pads 30, to the board 120. Use of a solder ball composed of the off-eutectic composition of the present invention would achieve the same rework advantages already discussed in that most of the solder balls would remain attached to the module after rework. This will reduce the time and effort needed to clean and redress the board or card attach sites.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An off-eutectic solder composition consisting essentially of:

between 90.0–99.0% Sn;

between 10.0–1.0% Cu; and having inter-metallics with a melting temperature greater than 280° C.

2. The off-eutectic solder composition of claim 1, wherein said composition is about:

93.0% Sn;

7.0% Cu; and having dispersed grains of SnCu inter-metallic phase structure.

3. The off-eutectic solder composition of claim 2, wherein said inter-metallic phase structure comprises $Cu_6Sn_5$ at a temperature greater than 300° C.

4. The off-eutectic solder composition of claim 2, wherein said inter-metallic phase structure comprises $Cu_3Sn$ at a temperature greater than 300° C.

5. The off-eutectic solder composition of claim 2, wherein said composition has a volume between 2,000 and 7,000 cubic mils.

6. An off-eutectic solder composition consisting essentially of:

between 80.0–96.0% Sn;

between 20.0–4.0% Ag; and having inter-metallics with a melting temperature greater than 280° C.

7. The off-eutectic solder composition of claim 6, wherein said composition is about:

82.0% Sn;

18.0% Ag; and having dispersed grains of SnAg inter-metallic phase structure.

8. The off-eutectic solder composition of claim 7, wherein said inter-metallic phase structure comprises $Ag_3Sn$ at a temperature greater than 280° C.

9. The off-eutectic solder composition of claim 7, wherein said composition has a volume between 2,000 and 7,000 cubic mils.

10. The off-eutectic solder composition of claim 6, wherein said composition is about:

88.0% Sn;

12.0% Ag; and having dispersed grains of SnAg inter-metallic phase structure.

11. The off-eutectic solder composition of claim 8, wherein said inter-metallic phase structure comprises $Ag_3Sn$ at a temperature greater than 280° C.

12. The off-eutectic solder composition of claim 10, wherein said composition has a volume between 2,000 and 7,000 cubic mils.

13. A method for creating a lead free solder melting hierarchy for second level solder assembly comprising the steps of:

providing an electronic module having bottom surface metallurgy pads on a bottom surface of said electronic module;

placing off-eutectic lead free solder on said bottom surface metallurgy pads as a solid off-eutectic lead free solder preform;

placing a first end of lead free columns in contact with said off-eutectic lead free solder;

heating said off-eutectic lead free solder to reflow said off-eutectic lead free solder and form module side off-eutectic lead free solder fillets which adhere said first end of lead free columns to said bottom surface metallurgy pads;

providing a circuit board having contact pads on a top surface of said circuit board;

applying a solder paste to said contact pads;

placing a second end of lead free columns in contact with said solder paste;

heating said solder paste to reflow said solder paste and form card side solder fillets which adhere said second end of lead free columns to said contact pads thereby creating a solder hierarchy for the second level solder assembly.

14. The method of claim 13 wherein said module side off-eutectic solder fillets have a composition of about 93.0% Sn, 7.0% Cu and have dispersed grains of SnCu inter-metallic phase structure.

15. The method of claim 13 wherein said module side off-eutectic solder fillets have a composition of about 82.0% Sn, 18.0% Ag and have dispersed grains of SnAg inter-metallic phase structure.

16. The method of claim 13 wherein said module side off-eutectic solder fillets have a composition of about 88.0% Sn, 12.0% Ag and have dispersed grains of SnAg inter-metallic phase structure.

* * * * *